United States Patent [19]

Leupold

[11] Patent Number: 5,523,731
[45] Date of Patent: Jun. 4, 1996

[54] SIMPLIFIED METHOD OF MAKING LIGHT-WEIGHT MAGNETIC FIELD SOURCES HAVING DISTORTION-FREE ACCESS PORTS

[75] Inventor: Herbert A. Leupold, Eatontown, N.J.

[73] Assignee: The United States of America as represented by the Secretary of the Army, Washington, D.C.

[21] Appl. No.: 424,131

[22] Filed: Apr. 12, 1995

[51] Int. Cl.$^6$ .............................. H01F 41/02; H01F 7/02
[52] U.S. Cl. ...................................... 335/306; 29/607
[58] Field of Search .................................... 335/302–306; 29/607, 609

[56] References Cited

U.S. PATENT DOCUMENTS

| | | |
|---|---|---|
| H591 | 5/1989 | Leupold . |
| 4,835,506 | 5/1989 | Leupold . |
| 4,837,542 | 6/1989 | Leupold . |
| 4,839,059 | 6/1989 | Leupold . |
| 4,862,128 | 8/1989 | Leupold ................................. 335/306 |
| 4,999,600 | 3/1991 | Aubert ................................... 335/306 |
| 5,028,903 | 7/1991 | Aubert ................................... 335/306 |
| 5,103,200 | 4/1992 | Leupold . |
| 5,216,401 | 6/1993 | Leupold . |
| 5,274,309 | 12/1993 | Leupold ................................. 315/382 |
| 5,337,472 | 8/1994 | Leupold et al. ......................... 29/607 |
| 5,396,209 | 3/1995 | Leupold ................................. 335/306 |

OTHER PUBLICATIONS

Leupold et al, "Novel High–Field Permanent–Magnet Flux Sources", IEEE Transactions on Magnetics, vol. MAG–23, No. 5, pp. 3628–3629, Sep. 1987;.

Leupold et al, "A Catalogue of Novel Permanent–Magnet Field Sources", Paper No. W3.2, 9th International Workshop on Rare–Earth Magnets and Their Applications, pp. 109–123, Aug. 1987, Bad Soden, FRG;.

Leupold et al, "Design applications of magnetic mirrors", Journal of Applied Physics, 68(8), 15 Apr. 1988, pp. 3987–3988;.

Leupold et al, "Applications of yokeless flux confinement", Journal of Applied Physics, 64(10), 15 Nov. 1988, pp. 5994–5996;.

Abele et al, "A general method for flux confinement in permanent–magnet structures", Journal of Applied Physics, 64(10), 15 Nov. 1988, pp. 5988–5990.

*Primary Examiner*—Leo P. Picard
*Assistant Examiner*—Raymond M. Barrera
*Attorney, Agent, or Firm*—Michael Zelenka; James A. Digiorgio

[57] ABSTRACT

A simplified method of making permanent magnet structures, such as magic rings and magic spheres, from a uniformly magnetized permanent magnet shell. Thus, through the inventive method, building such structures requires only one remanence. For example, to make a magic ring providing a uniform internal magnetic field that can be accessed through non-distorting ports, a uniformly magnetized cylindrical shall is cut into ultra-thin washer shaped pieces. One half of the washer shaped pieces are radially cut into pie shaped pieces. The pie shaped pieces of each sliced-up washer-shaped piece are then rotated or transposed to form ultra-thin magic ring slices. The magic ring slices are then alternately stacked with the remaining washer shaped pieces to form a magic ring having predetermined regions wherein the shell magnetization is zeroized. Thus, the shell material in these regions can be removed to provide distortion-free access to the internal field. Similarly, a magic sphere structure can be formed from a single remanence material, as well as others.

4 Claims, 4 Drawing Sheets

SIMPLIFIED METHOD OF MAKING LIGHT-WEIGHT MAGNETIC FIELD SOURCES HAVING DISTORTION-FREE ACCESS PORTS

GOVERNMENT INTEREST

The invention described herein may be manufactured, used, and licensed by or for the Government for governmental purposes without the payment to me of any royalty thereon.

BACKGROUND OF THE INVENTION

The present invention relates to high-field permanent magnets. More specifically, it relates to permanent magnet structures that provide internal uniform magnetic fields that can be accessed through non-distorting access ports.

One of the most critical problems confronting designers of high-intensity internal magnetic field sources has been accessing the internal field without distorting it. More specifically, those skilled in the art know that drilling an access port in the shell of a magnetic structure that produces an internal magnetic field can significantly distort the uniformity of that internal field, and thus severely limit the usefulness of the structure. The following references show many types of magnetic structures that can be utilized for such purposes:

Leupold, U.S. Pat. No 4,835 506 issued 30 May 1989, entitled "Hollow Substantially Hemispherical Permanent Magnet High-Field Flux Source;"

Leupold, U.S. Pat. No. 4,837,542, issued 6 Jun. 1989, entitled "Hollow Substantially Hemispherical Permanent Magnet High-Field Flux Source for Producing a Uniform High Field;"

Leupold, U.S. Pat. No. 4,839,059, issued 13 Jun. 1989, entitled "Clad Magic Ring Wigglers;"

Leupold, U.S. Statutory Invention Registration H591, published 7 May 1989, entitled "Method of Manufacturing of a Magic Ring;"

Leupold et al., "Novel High-Field Permanent-Magnet Flux Sources," *IEEE Transactions on Magnetics*, vol. MAG-23, No. 5, pp. 3628–3629, September 1987;

Leupold et al., "A Catalogue of Novel Permanent-Magnet Field Sources," Paper No. W3.2, 9th *International Workshop on Rare-Earth Magnets and Their Applications*, pp 109–123, August 1987, Bad Soden, FRG;

Leupold et al, "Design applications of magnetic mirrors," *Journal of Applied Physics*, 63(8), 15 Apr. 1988, pp. 3987–3988; Leupold et al, "Applications of yokeless flux confinement," *Journal of Applied Physics*, 64(10), 15 Nov. 1988, pp. 5994–5996; and Abele et al., "A general method for flux confinement in permanent-magnet structures," *Journal of Applied Physics*, 64(10), 15 Nov. 1988, pp. 5988–5990.

Leupold, U.S. Pat. No. 5,103,200, issued 7 Apr. 1992, entitled "High-Field Permanent Magnet Flux Source."

These references show many different permanent-magnet structures. Each structure having a permanent magnet shell that produces a uniform magnetic field of unusually high intensity in an internal cavity. Holes are drilled through the shell to form ports through which the internal field can be accessed. Drilling the port holes, however, removes critical magnetic material from the shell, thus disrupting the uniformity of the shell's magnetization which, in turn, distorts the uniformity of the internal field. Consequently, such structures are unacceptable for high precision applications.

One solution to this distortion problem was recently described by the present inventor in U.S. Pat. No. 5,216,401, entitled, MAGNETIC FIELD SOURCES HAVING NON-DISTORTING ACCESS PORTS, issued 1 Jun. 1993, and incorporated herein by reference. This patent discloses structures having a permanent magnet shell that produces an internal uniform magnetic field accessed through non-distorting ports drilled in predetermined regions of the shell. The amount of material needed to construct the shell, however, is minimized as compared to the prior art, and thus the overall size and weight of these structures is significantly reduced. In order to minimize the amount of material comprising the shell and still provide access ports to the internal uniform magnetic field without distorting that field, the remanence of the shell is varied as a function of the polar angle around the shell. As a result, to construct such a remanence-varying shell, the artisan is required to have access to and assemble many different permanent magnets. Thus, it is difficult, time-consuming and costly to construct these structures.

Consequently, this technique is undesirable for those who do not have the resources nor the time necessary to complete this formidable time consuming task. As a result, those skilled in the art would welcome a simplified method of constructing such magic sphere and magic ring structures.

SUMMARY OF THE INVENTION

Accordingly, it is an object of this invention to provide a simple, cost efficient and less time demanding method for building permanent magnet structures that provide distortion-free access to high-intensity uniform internal magnetic fields. To attain this, the present invention provides a method for building a structure having a shell that is constructed from as little as one uniformly magnetized permanent magnet material having one remanence. As a result, the method of the present invention enables an artisan to build the magic rings and magic spheres, as described in the prior art, from as little as one permanent magnet material, and thus as little as one remanence.

More specifically, the inventive method alternately stacks ultra-thin magic ring slices and uniformly magnetized cylindrical slices to form a permanent magnet shell, ring or sphere, that produces a high-intensity uniform internal field. The alternating slices are stacked such that the magnetization in predetermined regions of the shell is effectively zero. More specifically, the magnetization of adjacent slices in these regions have equal magnitudes but point in opposite directions. As a result, the shell material in those regions can be removed to provide access ports to the internal field without distorting that field. Also, since the magic slices generate an internal field and the uniform slices generate no internal field, the internal field of the resultant structure has a magnitude which is essentially the average of the internal fields of the individual ultra-thin slices. Moreover, the alternating slices are made thin enough that the uniformity of the internal field is only minimally disrupted at the interface between the alternating slices.

In one embodiment of the inventive method, a magic ring is formed from a uniformly magnetized cylindrical permanent magnet shell. More specifically, a uniformly magnetized cylinder is cut into ultra-thin washer-shaped pieces. One-half of the washer shaped pieces are further cut into a predetermined number of pie-shaped pieces. The pie-shaped pieces are then either rotated or transposed within their respective washer shaped piece to form "magic ring pieces" as taught in U.S. Pat. No. 5,337,472 issued Aug. 16, 1994, to Leupold et al. Then, the magic ring pieces are alternately stacked with the remaining one-half of the washer-shaped pieces to form a magic ring shell having predetermined regions wherein the magnetization of the alternately stacked pieces zeroize each other. The shell material in these zeroized regions are removed or drilled to provide access ports to the internal magnetic field without distorting the field.

In another embodiment of the inventive method, a magic sphere is formed from a uniformly magnetized cylindrical permanent magnet shell in a manner similar to the magic ring embodiment described above, except the ultra thin washer-shaped pieces are beveled into wedge-shaped pieces. More specifically, a uniformly magnetized cylinder is cut into ultra-thin washer-shaped pieces which are beveled into wedge-shaped pieces. One-half of the wedge-shaped pieces are further cut into a predetermined number of pie-shaped pieces. The pie-shaped pieces are then either rotated within their respective washer shaped piece to form a jagged version of "magic sphere" pieces as taught in U.S. Pat. No. 5,337,472 issued Aug. 16, 1994, to Leupold et al. These magic sphere pieces are alternately stacked with the remaining one-half of the wedge-shaped pieces to form a jagged or pseudo magic sphere shell having predetermined regions wherein the magnetization of the alternately stacked pieces zeroize each other. The shell material in these zeroized regions are removed or drilled to provide access ports to the internal magnetic field without distorting the field.

As a result, structures constructed under the inventive method described herein are very similar to the "magic" structures described in the prior art, but they do not require the many different permanent magnet pieces having different remanences, as described in the prior art. Consequently, the inventive method described herein overcomes to a large extent the problems associated with the prior art.

These and other features of the invention are described in more complete detail in the following description of the preferred embodiment when taken with the drawings. The scope of the invention, however, is limited only by the claims appended hereto.

DETAILED DESCRIPTION OF THE INVENTION

Generally, the inventive method described herein involves the alternate stacking of very thin cut slices of uniformly magnetized material with very thin slices of "magic ring pieces" to form a permanent magnet structure that generates an uniform internal magnetic field that can be accessed through predetermined points on the permanent magnet structure without distorting that field.

Figure 1A:
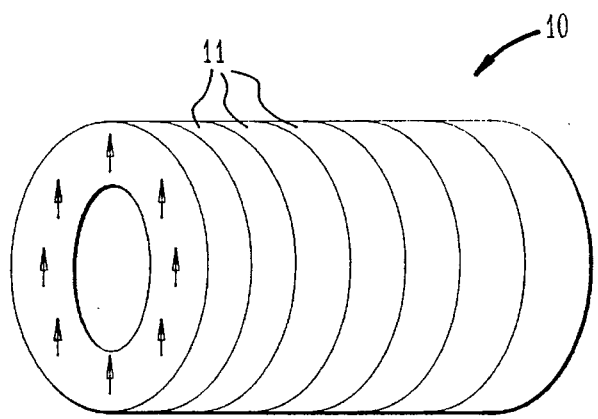
FIG. 1A is a pictorial view of a uniformly magnetized cylindrical permanent magnet shell cut into washer shaped slices.
Figure 1B:
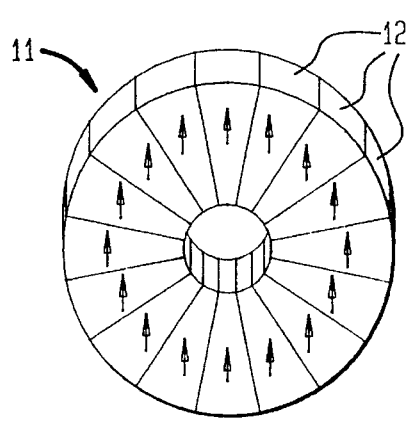
FIG. 1B is a crossectional view of one of the washer shaped slices of FIG. 1A cut into pie shaped pieces.
Figure 1C:
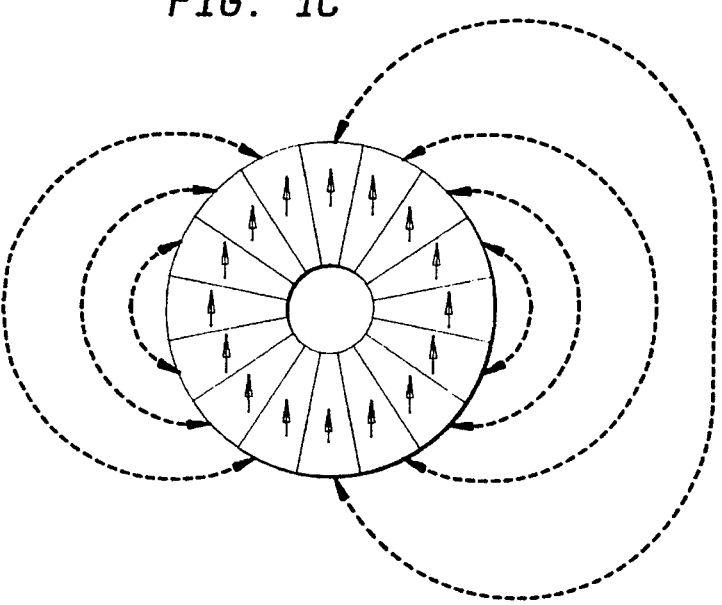
FIG. 1C is a pictorial view of the method of rotating the pie-shaped pieces to get a magic ring piece.
Figure 1D:
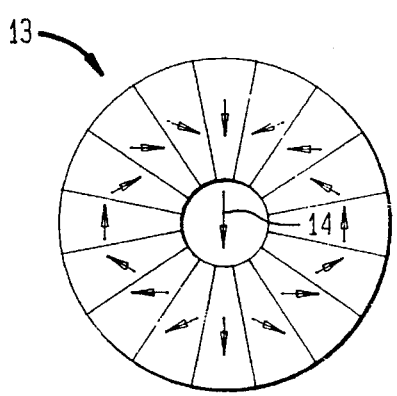
FIG. 1D is a crossectional view of a magic ring piece.

Referring now to FIGS. 1A–D, 2 and 3, there is shown one embodiment of the inventive method described herein. More specifically, uniformly magnetized cylindrical permanent magnet shell 10 is converted into magic ring 15. As shown, uniformly magnetized cylindrical shell 10 is axially sliced into ultra-thin washer-shaped pieces 11 having no internal magnetic field. One-half of washer shaped pieces 11 are radially sliced into pie-shaped pieces 12, as shown in FIG. 1B. These pie-shaped pieces are rotated or transposed, as shown in FIG. 1C, to make magic ring piece 13 having internal field 14, as shown in FIG. 1D.

Figure 2:
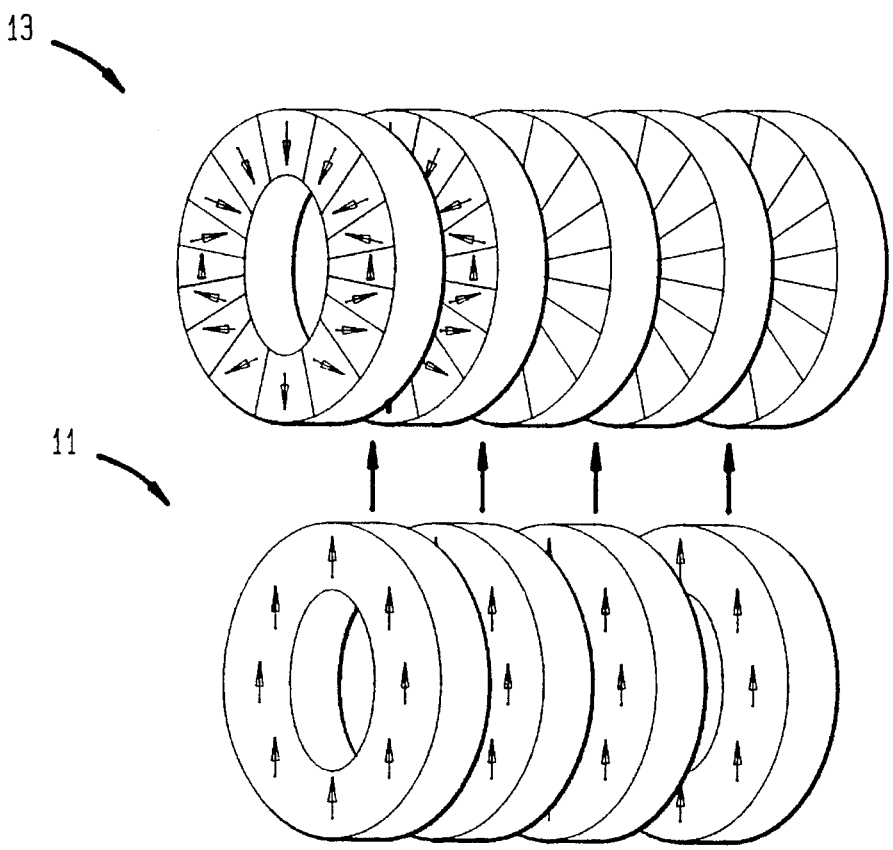
FIG. 2 is a pictorial view of the method for alternately stacking uniformly magnetized washer-shaped slices with magic ring pieces to make a magic ring.
Figure 3:
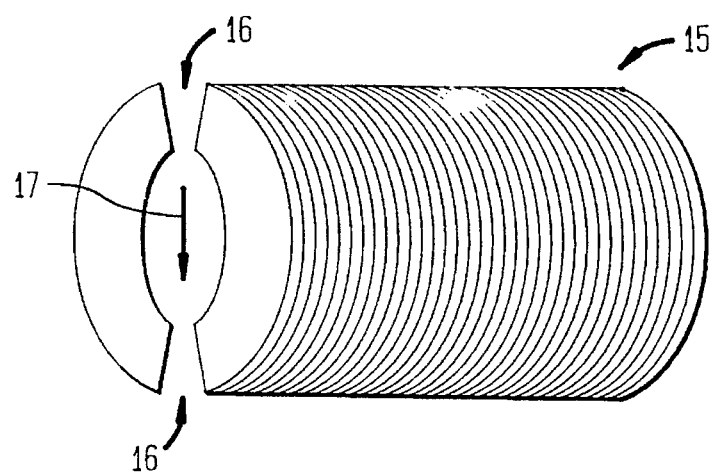
FIG. 3 is a side view of a magic ring made from the inventive method described herein.
Figure 4A:
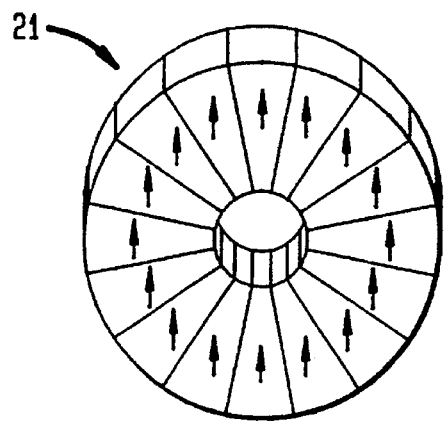
FIG. 4A is a crossectional view of a uniformly magnetized washer-shaped piece.
Figure 4B:
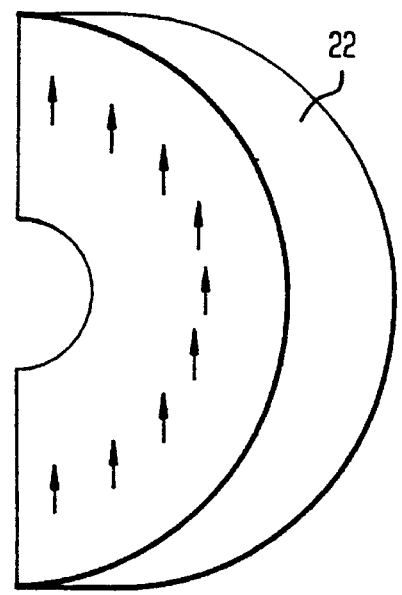
FIG. 4B is a crossectional view of the washer-shaped piece of FIG. 4A after it has been cut in half and beveled into a wedge-shaped piece.
Figure 4C:
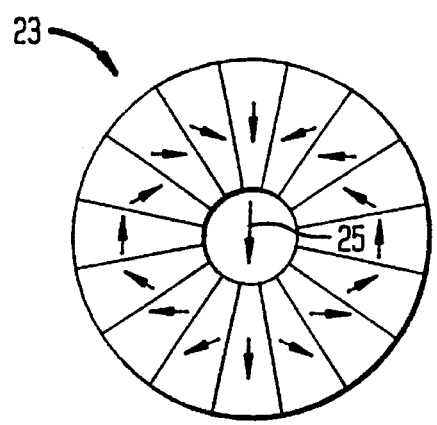
FIG. 4C is a crossectional view of a magic ring piece.
Figure 4D:
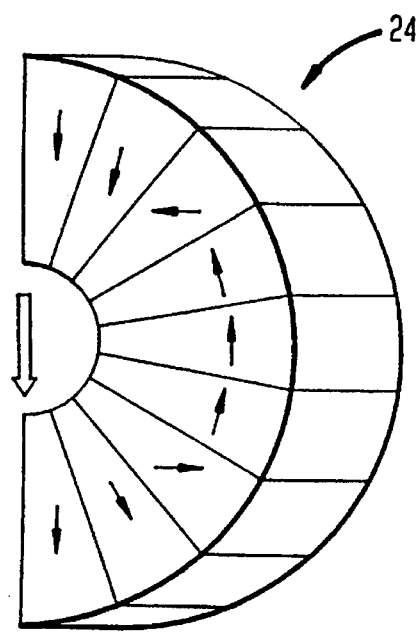
FIG. 4D is a crossectional view of the magic ring piece of FIG. 4C after it has been cut in half and beveled into a magic sphere piece.

Magic ring pieces 13 and the remaining washer-shaped pieces 11 are then alternately stacked as shown in FIG. 2 to make magic ring 15 as shown in FIG. 3. Magic ring 15 generates a uniform internal field 17 which is essentially the average of the internal fields generated by alternating slices 11 and 13. Moreover, magic ring pieces 13 and washer-shaped pieces 11 are stacked such that the magnetization at the poles of magic ring 15 is essentially zeroized. As a result, access ports 16 do not degrade or disrupt the uniformity of internal field 14.

Figure 5:
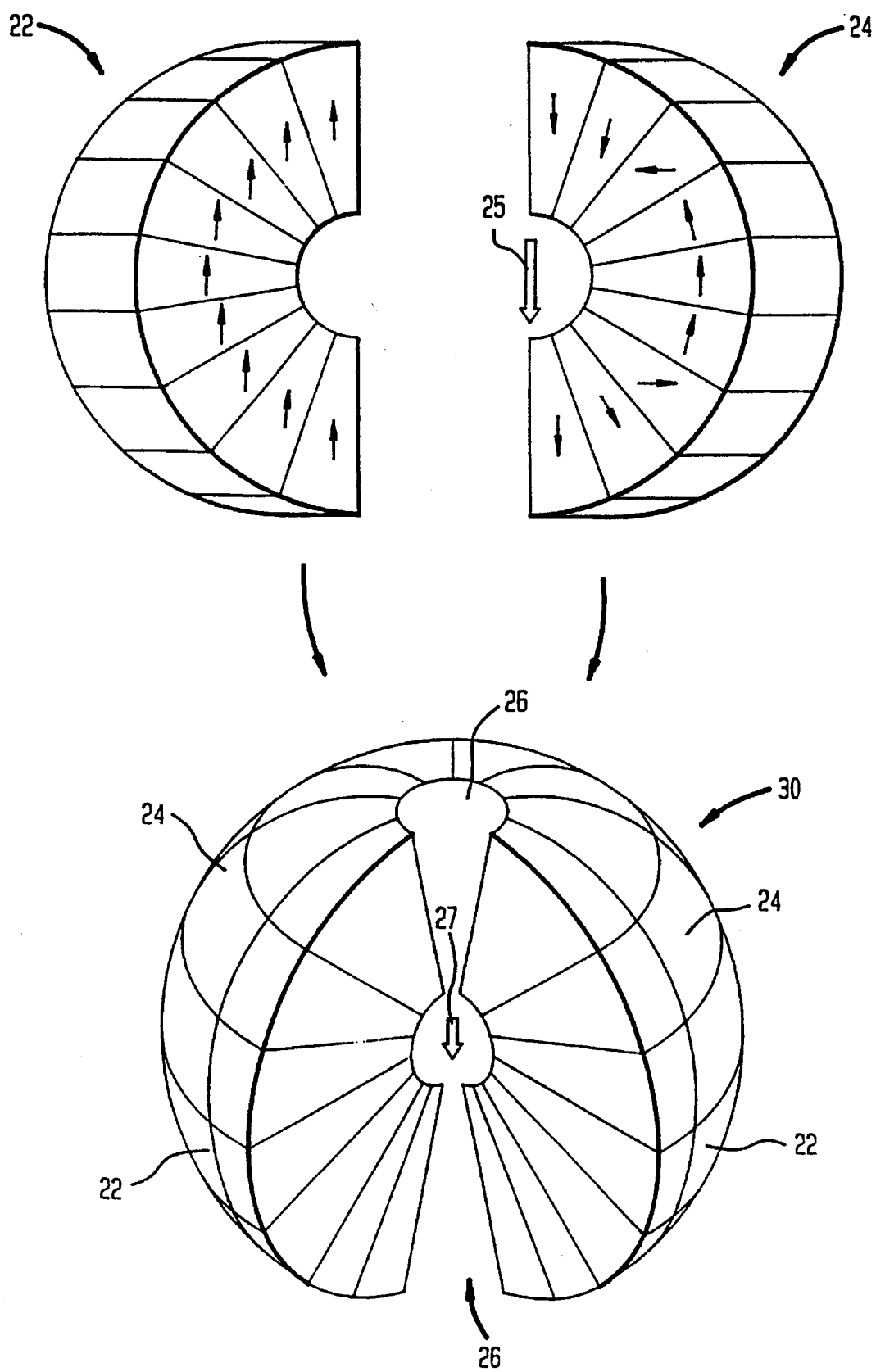
FIG. 5 is pictorial view of the method for alternately placing the magic sphere pieces with the uniformly magnetized wedge-shaped pieces to make a magic sphere.

Another embodiment of the inventive method is shown in FIGS. 4A–D and FIG. 5 wherein magic ring pieces 23 and uniformly magnetized washer-shaped pieces 21 are cut and beveled into wedge-shaped pieces that are alternately stacked to form magic sphere 30. As shown, uniformly magnetized washer shaped pieces 21, having no internal field, are cut in half and beveled to form uniformly magnetized wedge-shaped pieces 22. In addition, Magic ring pieces 23 having internal field 25 are cut in half and beveled to form magic sphere pieces 24. Magic sphere pieces 24 and uniformly magnetized wedge-shaped pieces 22 are then alternately placed, as shown in FIG. 5, to form magic sphere 30 which generates a uniform internal field 27 which is essentially the average of the internal fields generated by alternately placed pieces 22 and 24. Magic sphere pieces 24 and wedge-shaped pieces 22, however, are placed such that the magnetization at the poles of magic sphere 30 is zeroized. As a result, access ports 26 do not degrade or disrupt the uniformity of internal field 27.

In light of the above teachings, many other variations of the present invention are possible. For example, the inventive technique may be applied to a variety of other magnetic flux sources to produce many other resultant structures having different predetermined shapes and sizes. It is therefore understood that within the scope of the applied claims, the invention may be practiced otherwise than specifically described.

What is claimed is:

1. A simplified method for building a magic ring structure, providing a uniform internal magnetic field that can be accessed through non-distorting port holes, from thin slices of uniformly magnetized washer-shaped permanent magnet pieces and thin slices of magic ring pieces, comprising the steps of:

alternately stacking the magic ring pieces and the washer-shaped pieces to form the magic ring, said alternate stacking such that the magnetization of predetermined areas of the magic ring is zeroized;

forming the port holes in said predetermined zeroized areas of the magic ring to provide the distortion-free access to the uniform internal magnetic field.

2. A simplified method for building a magic sphere from a uniformly magnetized spherical shell, comprising the steps of:

a. slicing the uniformly magnetized spherical shell into a predetermined number of uniformly magnetized wedge-shaped pieces;

b. slicing one-half of said predetermined number of said wedge-shaped pieces into pie-shaped pieces.

c. rotating said pie-shaped pieces of each said uniformly magnetized wedge-shaped piece to convert said predetermined number of wedge-shaped pieces into magic sphere pieces;

d. alternately stacking said magic sphere pieces and said uniformly magnetized wedge-shaped pieces to form the magic sphere.

3. A simplified method for building a magic ring from a uniformly magnetized cylindrical shell, comprising the steps of:

a. slicing the uniformly magnetized cylindrical shell into a predetermined number of uniformly magnetized washer-shaped pieces;

b. slicing one-half of said predetermined number of said washer-shaped pieces into pie-shaped pieces.

c. rotating said pie-shaped pieces of each said uniformly magnetized washer-shaped piece to convert said predetermined number of washer-shaped pieces into magic ring pieces;

d. alternately stacking said magic ring pieces and said uniformly magnetized washer-shaped pieces to form the magic ring.

4. A simplified method for building a magic sphere structure, providing a uniform internal magnetic field that can be accessed through non-distorting port holes, from thin slices of uniformly magnetized wedge-shaped permanent magnet pieces and thin slices of magic sphere pieces, comprising the steps of:

alternately stacking the magic sphere pieces and the uniformly magnetized wedge-shaped pieces to form the magic sphere, said alternate stacking such that the magnetization of predetermined areas of the magic sphere is zeroized;

forming the port holes in said predetermined zeroized areas of the magic sphere to provide the distortion-free access to the uniform internal magnetic field.

* * * * *